United States Patent
Schmitt-Weaver et al.

(10) Patent No.: US 9,715,181 B2
(45) Date of Patent: Jul. 25, 2017

(54) METHOD OF CALIBRATING A LITHOGRAPHIC APPARATUS, DEVICE MANUFACTURING METHOD AND ASSOCIATED DATA PROCESSING APPARATUS AND COMPUTER PROGRAM PRODUCT

(71) Applicant: ASML NETHERLANDS B.V., Veldhoven (NL)

(72) Inventors: Emil Peter Schmitt-Weaver, Eindhoven (NL); Paul Frank Luehrmann, Eindhoven (NL); Wolfgang Henke, Kempen (DE); Marc Jurian Kea, Den Dungen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 669 days.

(21) Appl. No.: 14/103,486

(22) Filed: Dec. 11, 2013

(65) Prior Publication Data
US 2014/0168620 A1 Jun. 19, 2014

Related U.S. Application Data

(60) Provisional application No. 61/736,992, filed on Dec. 13, 2012.

(51) Int. Cl.
*G03F 7/20* (2006.01)
(52) U.S. Cl.
CPC .................................. *G03F 7/70516* (2013.01)
(58) Field of Classification Search
CPC .................. G03F 7/70516; G03F 7/20
USPC .......................................................... 355/52
See application file for complete search history.

(56) References Cited

U.S. PATENT DOCUMENTS

| 6,251,745 | B1 * | 6/2001 | Yu ....................... G03F 7/70633 257/E21.53 |
| 7,042,552 | B1 * | 5/2006 | Werkman .............. G03F 9/7046 355/53 |
| 7,426,011 | B2 | 9/2008 | Zaal et al. |
| 7,605,907 | B2 | 10/2009 | Cramer et al. |
| 2005/0185174 | A1 | 8/2005 | Van Der Laan et al. |
| 2006/0023194 | A1 * | 2/2006 | Loopstra ............. G03F 7/70458 355/72 |
| 2007/0052940 | A1 * | 3/2007 | Zaal .................... G03F 7/70341 355/53 |
| 2011/0205510 | A1 | 8/2011 | Menchtchikov et al. |
| 2011/0205515 | A1 | 8/2011 | Menchtchikov et al. |

(Continued)

*Primary Examiner* — Steven H Whitesell Gordon
*Assistant Examiner* — Jerry Brooks
(74) *Attorney, Agent, or Firm* — Pillsbury Winthrop Shaw Pittman LLP

(57) ABSTRACT

A lithography tool is calibrated using a calibration substrate having a set of first marks distributed across its surface in a known pattern. The tool is operated to apply a pattern comprising a plurality of second marks at various positions on the substrate, each second mark overlying one of the first marks and being subject to an overlay error dependent on an apparatus-specific deviation. The second marks are applied by multiple exposures while the substrate remains loaded in the tool. An operating parameter of the apparatus is varied between the exposures. An overlay error is measured and used to calculate parameter-specific, apparatus-specific calibration data based on knowledge of the parameter variation used for each exposure.

20 Claims, 8 Drawing Sheets

(56) References Cited

U.S. PATENT DOCUMENTS

| | | |
|---|---|---|
| 2011/0205520 A1 | 8/2011 | Padiy et al. |
| 2012/0008127 A1 | 1/2012 | Tel et al. |
| 2012/0013881 A1* | 1/2012 | Den Boef .............. G03B 27/52 355/67 |
| 2012/0330592 A1 | 12/2012 | Bottiglieri et al. |

* cited by examiner

METHOD OF CALIBRATING A LITHOGRAPHIC APPARATUS, DEVICE MANUFACTURING METHOD AND ASSOCIATED DATA PROCESSING APPARATUS AND COMPUTER PROGRAM PRODUCT

This application claims priority and benefit under 35 U.S.C. §119(e) to U.S. Provisional Patent Application No. 61/736,992, filed on Dec. 13, 2012. The content of the foregoing application is incorporated herein in its entirety by reference.

FIELD

The present invention relates to a method for calibrating a lithographic apparatus, a method of manufacturing a device using a lithographic apparatus calibrated by such a method, and to a data processing apparatus and computer program product to implement at least part of such a method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to monitor the lithographic process, one or more parameters of the patterned substrate, for example the overlay error between successive layers formed in or on it and/or critical line width in a developed metrology target, are typically measured. There are various techniques for making measurements of the microscopic structures formed in lithographic processes, including the use of a scanning electron microscope and/or other various specialized tools. A fast and non-invasive form of specialized inspection tool is a scatterometer in which a beam of radiation is directed onto a target on the surface of the substrate and a property of the scattered or reflected beam is measured. Providing a scatterometer or other metrology tool separate from the lithographic apparatus allows detailed measurements to be made in parallel with production.

SUMMARY

In order to better control scanner functionality, a module can be used which automatically drives the system towards a pre-defined baseline each day. This scanner stability module retrieves standard measurements taken from a stability monitor substrate using a metrology tool. The monitor substrate had been previously exposed using a special patterning device containing one or more special scatterometry marks (or one or more other marks suitable for whatever other metrology tool is to be used). Using the monitor substrate and that day's measurements (and possibly the historical measurement data from one or more previous days), the scanner stability module determines how far the system has drifted from its baseline, and then calculates substrate-level overlay and focus correction sets. The lithography system then converts these correction sets into specific corrections for each exposure on subsequent production substrates.

While the scanner stability module attends to stability of performance of a lithography tool over time, there remains generally a need to perform initial calibration of the tool when it is installed, and after any major interruption in operation. This calibration may reveal and correct many more detailed machine-specific characteristics of the apparatus and its various subsystems, which may also vary with different modes of operation. This more detailed calibration may be done by a conventional process using one or more specially manufactured reference substrates and associated exposure and measurement processes. After an interruption in operation, the calibration may need to be performed again. Interruption of production using these tools can be very costly.

One example of such a stability monitoring process and various calibration methods are described in U.S. patent application publication no. US 2012/0008127. These methods go some way to reducing the throughput penalty of a calibration procedure and/or stability monitoring, and/or to reduce the cost of calibration materials used in such procedures. Some embodiments of the present invention integrate a stability monitoring process and a calibration process in such a manner that productivity is less disrupted.

Calibration and monitoring methods of the type mentioned become ever more important, as product features reduce in size and further reduction of overlay error becomes ever more critical to maintaining productivity and quality in the manufactured devices. Each further reduction in overlay may involve new sources of error to be identified, measured and corrected, which implies ever more detailed measurement of the performance of a lithography tool in more and more different modes of operation. Even with the methods described in U.S. patent application publication no. US 2012/0008127, the desire for more detailed measurements and corrections may conflict with the desire to keep machines operating productively for the highest possible proportion of their working life.

Accordingly, it is desirable, for example, to enable calibration of a lithographic apparatus with reduced loss of productivity. Embodiments of the present invention aim to enable more detailed calibration of lithographic apparatus, while maintaining productivity.

In an aspect, there is provided a method of calibrating a lithographic apparatus, the method comprising:

(a) supporting a calibration substrate in the lithographic apparatus using a substrate support, the calibration substrate carrying a set of first marks;

(b) operating a patterning system to apply a pattern comprising a set of second marks onto the calibration substrate, each second mark overlying a first mark;

(c) obtaining an overlay measurement on the basis of the overlying first and second marks; and (d) using the overlay measurement to calculate calibration data to correct an apparatus-specific deviation of the lithographic apparatus, wherein step (b) is repeated while the substrate remains supported by the substrate support so as to apply different sets of second marks while varying one or more operating parameters of the lithographic apparatus between applying the sets of second marks and including a shift between the different sets of second marks such that an overlay measurement of each set can be distinguished.

By using this method, it is possible to calculate parameter-specific, apparatus-specific calibration data based on knowledge of the parameter variation used to form different measured marks. The parameter-specific calibration data can be used to enhance the correction of specific errors during patterning operations on product substrates. The shifting of the applied pattern in exemplary embodiments is sufficient so that the second marks of the pattern applied at different times from overlying one another. In general, the only requirement is to ensure that overlay measurements can be obtained that somehow distinguish the effects of the changed operating parameters.

In some embodiments of the invention, the patterning and measuring for stability monitoring, of the type described in the introduction, can be performed as part of the repetitions in step (b). If desired, some or all of the measurements in step (c) can be performed on an apparatus separate from the lithographic apparatus being calibrated. Thus embodiments of the invention can be designed so as to implement both initial set-up and stability monitoring, with reduced interruption in processing throughput.

An embodiment of the invention may be applied in different types of lithographic apparatus, whether optical or imprint, for example. In the example of an optical, scanning type apparatus, examples of parameters that may be varied between times include field size, field center, illumination mode, scan direction, step direction and/or alignment model. The parameter-specific, apparatus-specific calibration data may include interfield calibration data that defines one or more parameter-specific corrections to be applied across the substrate as a whole, and/or one or more parameter-specific intrafield corrections defining corrections to be applied within each field.

In an aspect, there is provided a method of manufacturing a device wherein a lithographic apparatus is used to apply a device pattern to a device substrate, and wherein as a preliminary step the lithographic apparatus is calibrated by a method as described herein. In an embodiment of such a method, the lithographic apparatus may continue to operate to apply one or more device patterns to one or more device substrates, concurrently with performance of step (c) and/or (d) of the method described above, and after completion of step (c) and/or (d), one or more device patterns is applied to one or more further device substrates using the obtained calibration data.

An embodiment of the invention may be implemented by suitable programming of an existing control system of a lithographic apparatus and/or associated equipment, and/or using a separate data processing apparatus.

In an aspect, there is provided a data processing apparatus programmed to calculating parameter-specific, apparatus-specific calibration data for a lithographic apparatus in accordance with a method described herein, based on a set of overlay measurements and on knowledge of parameter variations used to form different measured marks. Such a data processing apparatus may be further programmed to cause the lithographic apparatus to perform step (b) of the method described above in accordance with a stored recipe that defines a sequence of repetitions of step (b) and associated parameter variations.

In an aspect, there is provided a computer program product comprising instructions to causing a programmable data processing apparatus to perform a method as described herein or as a data processing apparatus as described herein.

These and other features and advantages of embodiment of the present invention will be understood by the skilled reader from a consideration of the exemplary embodiments discussed below. Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example only, with reference to the accompanying drawings in which.

DETAILED DESCRIPTION

Figure 1:
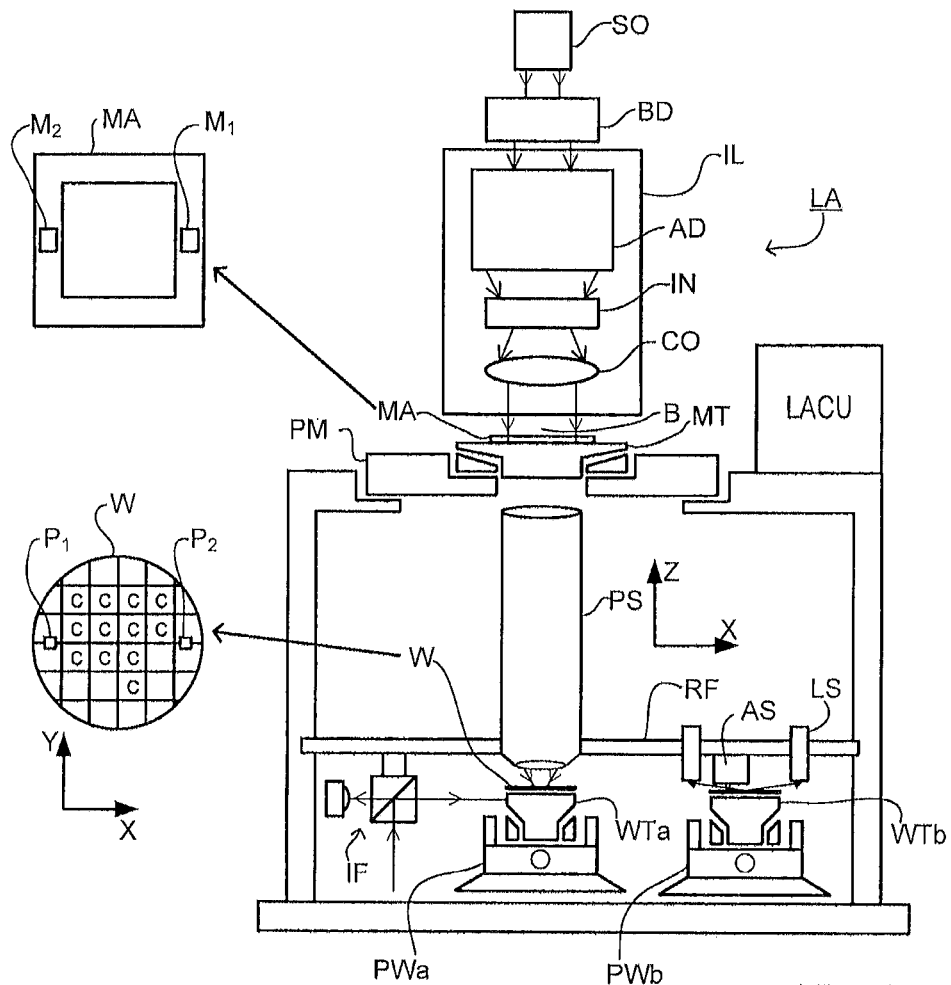
FIG. 1 depicts a lithographic apparatus, according to an embodiment of the present invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PWa or PWb configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure MT, and is patterned by the patterning device. Having traversed the patterning device MA, the radiation beam B passes through the projection system PS, which focuses the beam onto a target portion C of the substrate W. With the aid of the second positioner PWa/PWb and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PWa/PWb. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa and WTb and two stations, e.g., an exposure station and a measurement station, between which the tables may be exchanged. For example, while a substrate on a substrate table is being exposed at the exposure station, another substrate can be loaded onto another substrate table at the measurement station or a measurement table may be located at the measurement station, so that various preparatory steps may be carried out. The preparatory steps may include mapping the surface of the substrate using a level sensor LS and measuring the position of alignment markers using an alignment sensor AS. This enables a substantial increase in the throughput of the apparatus. If the position sensor IF is not capable of measuring the position of the table while it is at the measurement station as well as at the exposure station, a second position sensor may be provided to enable the positions of the table to be tracked at both stations. In a variation, for example, the apparatus may comprise a measurement table WTb and a substrate table WTa. In this variation, while the substrate table WTa is at a measurement station (where, for example, the substrate is unloaded and measurements do not necessarily occur at that station), the measurement table WTb is located at the exposure station to enable measurements (e.g., measurements using the projection system).

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
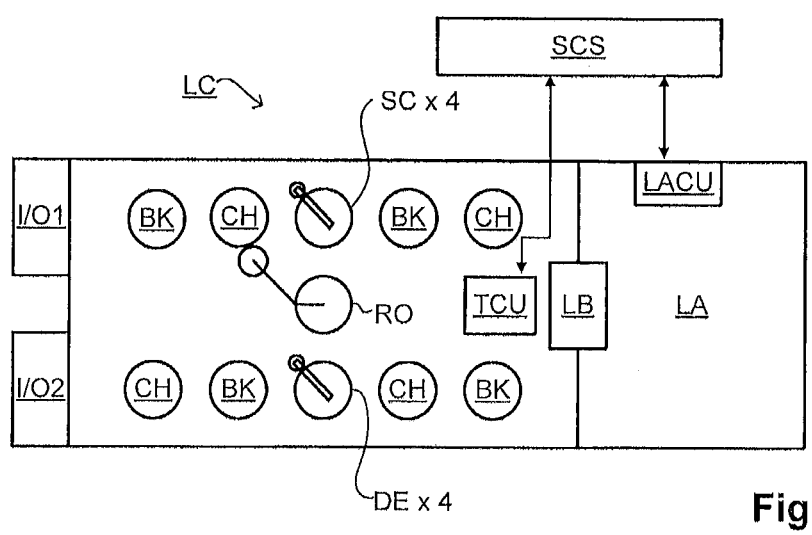
FIG. 2 depicts a lithographic cell or cluster including the apparatus of FIG. 1.

As shown in FIG. 2, the lithographic apparatus LA may be part of a lithographic cell LC, also sometimes referred to a 'lithocell' or cluster, which also includes apparatus to perform pre- and/or post-exposure processes on a substrate. Conventionally this lithographic cell LC may include one or more spin coaters SC to deposit resist layers, one or more developers DE to develop exposed resist, one or more chill plates CH and/or one or more bake plates BK. A substrate handler, or robot, RO picks up a substrate from an input/output port I/O1, I/O2, moves it between one or more different process apparatuses and delivers it then to the loading bay LB of the lithographic apparatus. These one or more devices, often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that a substrate that is exposed by the lithographic apparatus is exposed correctly and consistently, it is desirable to inspect an exposed substrate to measure a property such as overlay error between subsequent layers, line thickness, critical dimension (CD), etc. If an error is detected, an adjustment may be made to exposure of a subsequent substrate, especially if the inspection can be done soon and fast enough that another substrate of the same batch is still to be exposed. Also, an already exposed substrate may be stripped and reworked—to improve yield—or discarded, thereby avoiding performing exposure on a substrate that is known to be faulty. In a case where only some target portions of a substrate are faulty, further exposures can be performed only on those target portions which are good.

An inspection apparatus is used to determine one or more properties of a substrate, and in particular, how the one or more properties of different substrates or different layers of the same substrate vary from layer to layer. The inspection apparatus (not shown in FIG. 2) may be integrated into the lithographic apparatus LA or the lithocell LC or may be a stand-alone device. It may be a scatterometer, for example an angle-resolved scatterometer of the type described in U.S. patent application publication no. US2006-033921. To enable rapid measurement, it is desirable that the inspection apparatus measures a property in the exposed resist layer immediately after the exposure. However, the latent image in the resist has a very low contrast—there is only a very small difference in refractive index between a part of the resist which has been exposed to radiation and that part which has not—and not all inspection apparatuses have sufficient sensitivity to make useful measurement of a latent image. Therefore measurement may be taken after the post-exposure bake step (PEB) which is customarily the first step carried out on an exposed substrate and increases the contrast between the exposed and unexposed parts of the resist. At this stage, the image in the resist may be referred to as semi-latent. It is also possible to make measurement of the developed resist image—at which point either the exposed or unexposed part of the resist has been removed—or after a pattern transfer step such as etching. The latter possibility limits the opportunity for rework of a faulty substrate but may still provide useful information.

Calibration and Stability Control—Introduction

A significant component of accurate lithography is an ability to calibrate an individual lithographic apparatus. The lithographic apparatus will be referred to below as the "litho tool" or simply "tool", for convenience. In addition to one or more general parameters affecting the whole substrate area, one can map and model the error 'fingerprint' of an individual apparatus across the substrate area. This fingerprint, which can be established in terms of focus, dose and/or alignment, can be used during exposure to correct for the idiosyncrasy of that apparatus, and thereby achieve more accurate patterning. It is further desirable to compensate the idiosyncrasies of different machines in a "cluster" or "fleet" of tools working together in a manufacturing facility. The aim of this is to allow different tools to be used more interchangeably, and so that those idiosyncrasies will not affect multilayer devices whose different layers are patterned on different machines.

Improvement to the focus and overlay (layer-to-layer alignment) uniformity of tools may be achieved by the implementation of a stability module, leading to an optimized process window for a given feature size and chip application, enabling the continuation of the creation of smaller, more advanced chips. The stability module in an embodiment automatically resets the system to a pre-defined baseline at regular intervals, for example each day. To do this it retrieves standard measurements taken from a monitor substrate using a metrology tool such as the inspection apparatus mentioned above. The term monitor substrate can be used conveniently to refer to a substrate dedicated to the monitoring and calibration process, as opposed to a product substrate which is a substrate on which one or more actual devices are manufactured. The monitor substrate is exposed using a special patterning device (e.g., reticle) providing special marks adapted to be measured by the inspection apparatus. From that day's measurements, the stability module determines how far the apparatus performance has drifted from its baseline. It then calculates substrate-level overlay and/or focus correction sets. The lithography system then converts these correction sets into a specific correction for each exposure on one or more subsequent production substrates.

Figure 3:
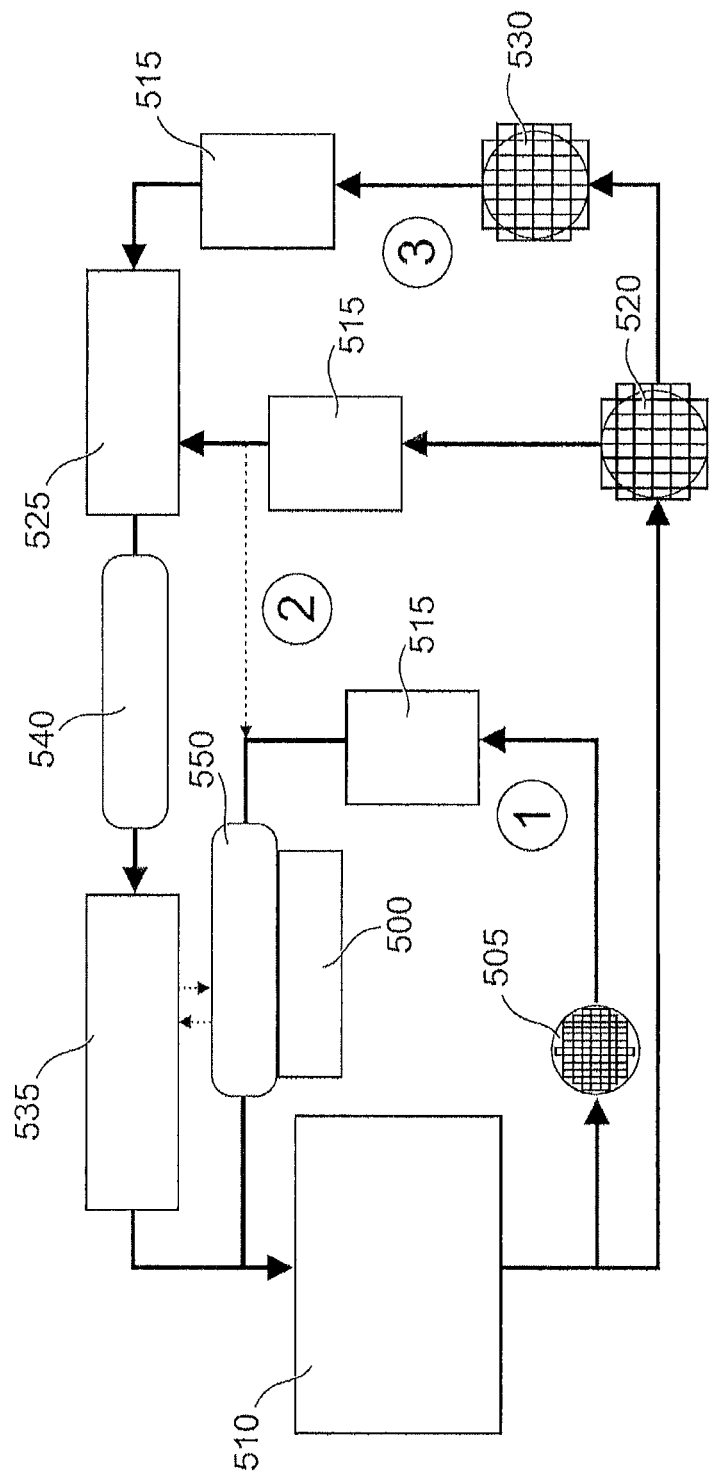
FIG. 3 is a schematic diagram of a control mechanism in a lithographic process utilizing a scanner stability module.

FIG. 3 depicts the overall lithography and metrology method incorporating the stability module 500 (essentially an application running on a server, in this example). Shown are three main process control loops, labeled 1, 2, 3. The first loop 1 provides the local control of the lithography apparatus using the stability module 500 and one or more monitor substrates. A monitor substrate 505 is shown being passed from a lithography apparatus 510, having been exposed to set the baseline parameters for focus and/or overlay. At a later time, metrology tool 515 reads these baseline parameters, which are then interpreted by the stability module 500 so as to calculate a correction routine so as to provide scanner feedback 550, which is passed to the lithography apparatus 510, and used when performing one or more further exposures. The exposure of the monitor substrate may involve printing a pattern of marks on top of reference marks. By measuring overlay error between the top and bottom marks, a deviation in performance of the lithographic apparatus can be measured, even when the monitor substrate has been removed from the apparatus and placed in the metrology tool.

The second (APC) loop 2 is for local scanner control on a product substrate (determining focus, dose, and/or overlay on a product substrate). The exposed product substrate 520 is passed to metrology unit 515 where information relating to, for example, one or more parameters such as critical dimension, sidewall angle and/or overlay is determined and passed onto the Advanced Process Control (APC) module 525. This data is also passed to the stability module 500. One or more process corrections 540 are made before the Manufacturing Execution System (MES) 535 takes over, providing control of the lithography apparatus 510, in communication with the scanner stability module 500.

The third control loop 3 is to allow metrology integration into the second (APC) loop (e.g., for double patterning). The post etched substrate 530 is passed to metrology unit 515 which measures one or more parameters such as critical dimension, sidewall angle and/or overlay, of the substrate. This data is passed to the APC module 525. The loop continues the same as with the second loop.

Calibration and Stability Control—First Example Method

Figure 4:
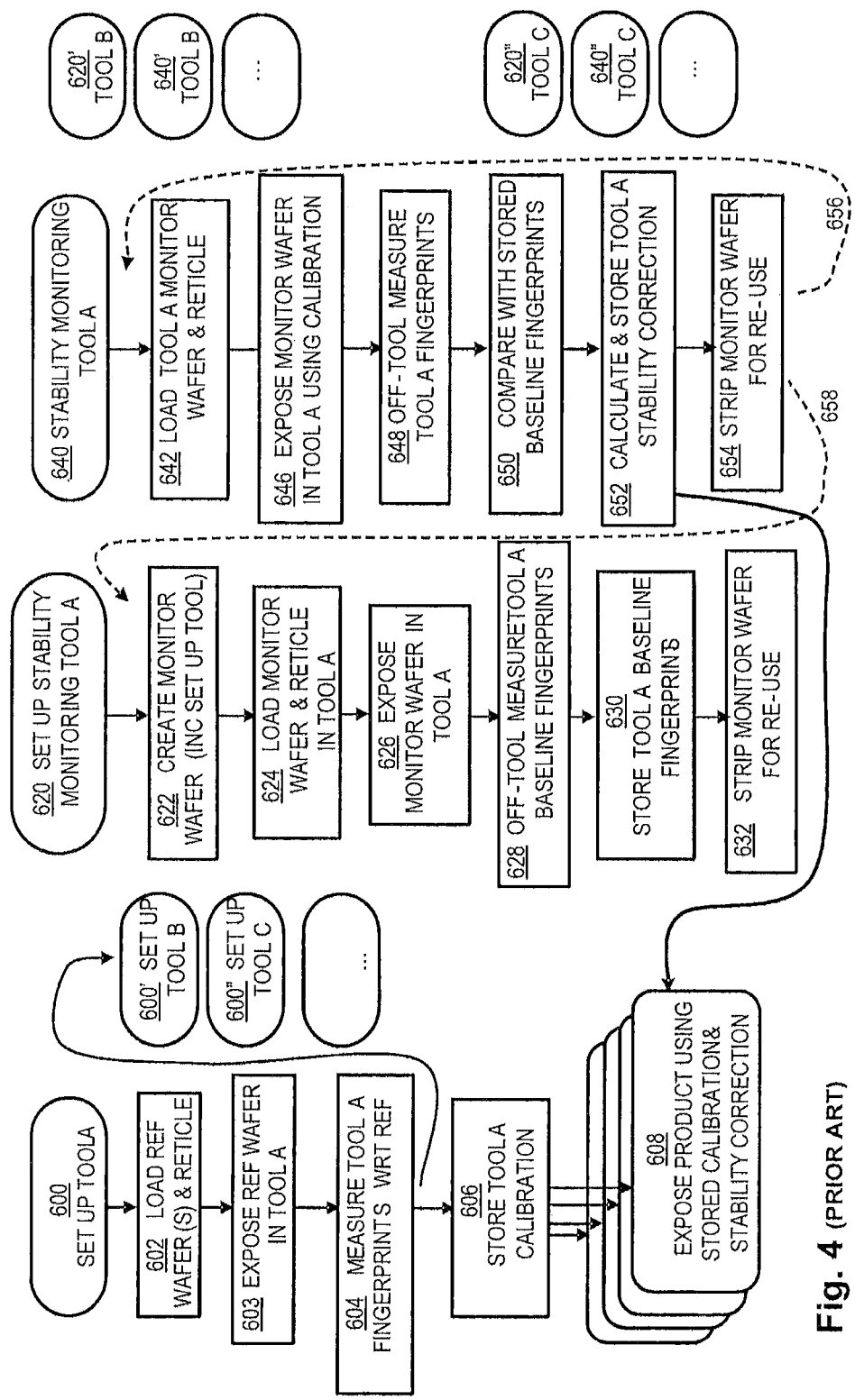
FIG. 4 illustrates a first set of calibration and stability monitoring processes using the scanner stability module of FIG. 3.

FIG. 4 illustrates, in flow chart form, example calibration and stability monitoring procedures. By way of background, it is envisaged that several lithography apparatuses (referred to hereafter as tools) may be present at a manufacturing facility. These can be referred as tools A, B, C, etc.

Three processes are described, labeled 600, 620 and 640, which are involved in the calibration and stability monitoring. The skilled reader will appreciate that these processes are described at a relatively high level only, and many details are omitted for the sake of brevity. Each machine is assumed, purely for the sake of example, to be a scanner type lithographic apparatus, and it may be of the type which has two tables (chucks), used in alternating fashion. For maximum performance in focus and/or overlay, calibration and monitoring is performed with attention to the difference between scan-up and scan-down exposures, as well as chuck-to-chuck variations. These details will be omitted from the description. The description will concentrate on overlay as the performance parameter of interest. The methods are applicable to other parameters, such as focus, and overlay is mentioned as an example only.

Process 600 relates to the initial set up of a lithography apparatus, for example, tool A. Only a simplified, example process will be described. The skilled reader will know that many steps are involved in the real set-up of a high performance lithography tool. At step 602, a special reference substrate is loaded which has, for example, a very accurate square grid of alignment marks etched upon it. A layer of resist has been coated on top of the etched marks and at step

603 this is exposed by the tool being calibrated, using an appropriate reference patterning device. In practice, a number of such reference substrates may be loaded and measured, and results combined statistically to attain high accuracy. For the simplicity of the present description, only a single measurement will be referred to, while the skilled reader can readily add the implementational details appropriate to the circumstances.

At step 604, one or more metrology sensors within the tool and/or outside the tool are used to measure various points across the reference substrate, and to determine one or more "fingerprints" of the tool itself, compared with the reference grid on the reference substrate. Measurements may be made on the etched marks, as well as on marks exposed on top of the etched marks. Where marks have been exposed on top of etched reference marks, overlay measurement can be made either using instrumentation of the tool itself, or using a separate metrology apparatus, when provided. Step 604 may in other words be performed partly off-tool. "Fingerprint" in this context is understood as the pattern of deviations across the substrate surface, by which a measurement delivered by the tool's own instrumentation and actuation differs from the actual position of a feature of the substrate. In addition, or alternatively, to a substrate-wide (interfield) fingerprint, a so-called intrafield fingerprint can be derived representing the deviations within each field that are repeated at each field location (substrate portion) across the substrate. As mentioned above, the set-up of a high-performance lithography tool is very complex, and in practice, different reference substrates, exposures and measurements may be implemented, each specialized for a different purpose. At step 606, the measured fingerprint(s) are stored as interfield and/or intrafield calibration data for tool A. As mentioned, separate data can be stored for scan-up and scan-down directions (particularly in the intrafield fingerprint). Data specific to individual tables (chucks) WTa and WTb can be stored, either in absolute terms or by deviation from a nominal fingerprint.

At step 608, the normal operation of a tool begins, exposing one or more product substrates. The stored calibration data is used to help ensure that positions measured using the tool's instrumentation are corrected to account for the appropriate fingerprint, allowing the tool to place features on the substrate as close as possible to the desired absolute positions on the substrate.

Similar set up operations are performed at 600' and 600" for other tools B, C, etc. A consideration in the efficient running of the manufacturing facility is that a product substrate should be able to be processed on any of the tools of a given type that may be available. The calibration process, using a common set of reference substrates and matching patterning devices, helps ensure that tools A, B, C, etc. are not only consistent in their own performance, but are matched to one another, so that different product layers on a product substrate can be formed using different tools, without significant overlay error.

As mentioned with respect to step 608 of FIG. 4, in this example, a product substrate is exposed using not only the calibration data from the reference substrate set up process 600, but also using a correction from a stability monitoring process, which will now be described. The function of the stability monitoring process is to maintain as far as possible the performance of each tool A, B, C at the level established in the set up process 600. The set up process 600 is time-consuming and the reference substrate can be delicate and expensive. It is therefore not a process that should be repeated regularly. The stability monitoring process, on the other hand, is designed to operate with minimal interruption to normal operations, and can be repeated, say, once a day.

Process 620 relates to the initialization of the stability monitoring process, which corresponds to the first loop 1 in FIG. 3. The stability monitoring is based on the use of a monitor substrate, which has a special pattern of (etched) features against which overlay of in-resist features can be measured. At step 622, a monitor substrate is created using, for example, a special monitoring substrate patterning device and an exposure and etching process (which is not described in detail). It is sufficient to note that the accuracy of the subsequent process depends on the tool being set up with high accuracy, before the manufacture of the monitor substrate. As in the case of the reference substrate, a set of monitor substrates may be generated, and the results of using a plurality of monitor substrates may be combined statistically to improve accuracy. The following description mentions only a single substrate, for simplicity.

At step 624, the monitor substrate, having the features, is loaded in the tool, with a layer of radiation-sensitive resist material coated on top of the features. A monitor patterning device is also provided in the tool.

At step 626, the monitor substrate is exposed using the monitor patterning device to create an in-resist pattern on top of the existing features. At step 628, the metrology unit 515 is used to measure the exposed monitor substrate and identify a "baseline" fingerprint. As before, the fingerprint may be measured separately for scan-up and scan-down directions, and may be measured separately for each chuck if the tool has more than one chuck. At step 630, the baseline fingerprint is stored for future reference. At step 632, the resist layer from the monitor substrate is stripped, so that it may be re-used for the daily stability monitoring process 640, described below.

The baseline fingerprint generated by process 620 records the performance of the machine at a particular instant in time. If this point in time is immediately after the initial set up process 600, and assuming that the machine is not highly unstable in its performance, then the baseline fingerprint should correspond to the ideal tool set up as defined by the reference substrate. Although the monitor patterning device and substrate may be cheaper items, not manufactured to the same accuracy as the reference substrate, the fact that the tool was in a known accurate condition when the exposure was made allows the baseline fingerprint to be used as a basis for adjusting the tool to the same accurate condition at future times.

Process 640 is then executed at intervals, to generate corrections which allow the machine to recover this baseline performance at any time. The monitor substrate and patterning device used in step 624 are used at step 642. At step 646, the monitor substrate is exposed, using the calibration stored in step 606. At step 648, the exposed substrate is measured in metrology unit 515 to measure a new fingerprint for the tool. At step 650 the measured fingerprint is compared with the baseline fingerprint. Any deviation is used at step 652 as the basis to generate stability correction data which is fed back into the control of production exposures at step 608. At step 654, the resist is stripped from the monitor substrate to make the monitor substrate ready for re-use. Path 656 represents the re-use of a monitor substrate in this way.

Whereas the complete set-up process 600 may take hours of time, during which the tool is unproductive, the stability monitoring process may occupy the tool only for a minute or two, while the monitor substrate is provided and exposed. The impact on production of performing stability corrections every day is therefore low. The substrate is re-used a set number of times (e.g., 10-20 times), or until it is found to be damaged. Consequently, there is a reasonably regular need to create a new monitor substrate. This involves a repeat of step 622, which in turn implies a repeat of the onerous set-up process 600. Consequently, although stability monitoring and correction is greatly facilitated, the process does not eliminate the need for use of the reference substrate and the concomitant loss of productivity.

As noted in the right hand side of FIG. 4, similar processes 620'/620" and 640'/640" can be applied to measure baseline performance and provide stability corrections for tools B, C, etc., using the monitor substrate that was made on the 'holy' tool A. In the course of stability monitoring, each monitoring substrate or set of monitoring substrates should be dedicated to its respective tool. When any of monitor substrate needs to be replaced, step 622 including process 620 is performed, interrupting production on the chosen reference tool. Path 658 represents the decision to scrap a worn out monitor substrate and create a new one.

Calibration and Stability Control—Second Example Method

Figure 5:
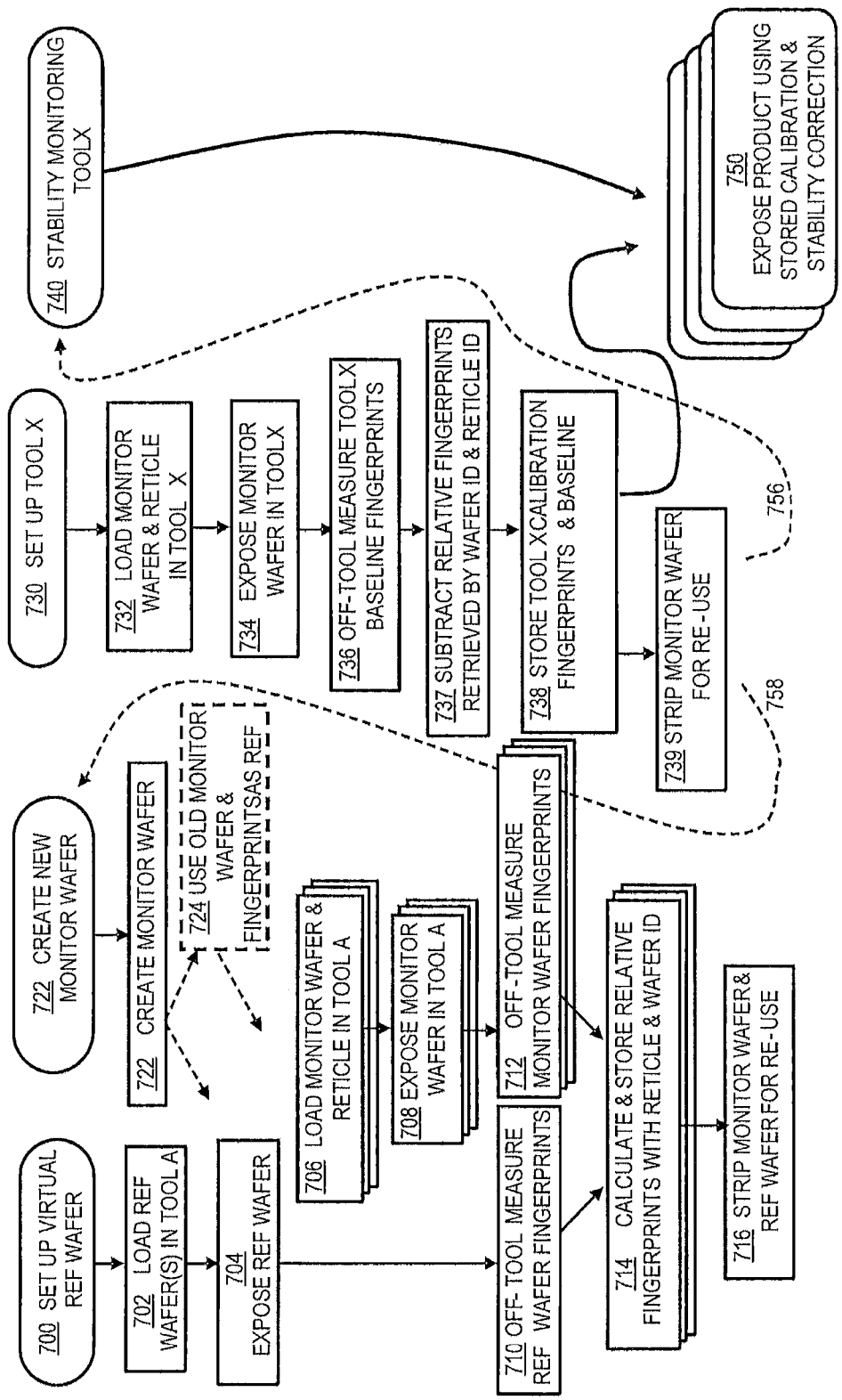
FIG. 5 illustrates a second set of calibration and stability monitoring processes using the scanner stability module adapted and operated, in accordance with an embodiment of the present invention.

FIG. 5 illustrates an example of a second method of the type disclosed in U.S. patent application publication no. US 2012-0008127. In this method, calibration and stability control processes of the type described above are integrated in such a manner that interruption to production can be reduced greatly, and in which matching of machines can be performed in fewer steps and with fewer logistical restrictions than by the processes of FIG. 4. The method can be implemented using the same apparatuses as described already with reference to FIGS. 1 to 3, simply by modification of control software and data structures in the control unit LACU. Other variations of the method will be described in a separate section below.

Process 700 replaces the machine set-up process 600 for routine operation of the tool (setup processes of the conventional kind will of course be required in the course of installation and major maintenance). A tool is selected, for example tool A, which has only to be in reasonably stable condition; not perfectly set up. The reference substrate and patterning device are provided in tool A at step 702 and exposed at step 704. Unlike process 600, the reference substrate is not measured within the tool, but is swapped for a monitor substrate and patterning device at step 706. The reference substrate and monitor substrate can be of the known types, though the method is adaptable to different forms. At step 708 the monitor substrate is exposed in the same tool as the reference substrate. The interval between exposure steps 704 and 708 is minimized so that the exposure parameters can be assumed identical for both. The exposed substrates are transferred to the metrology unit 515, so that normal production using tool A can resume.

At steps 710 and 712, metrology unit 515 measures interfield and/or intrafield overlay variation on the reference substrate and the monitor substrate respectively. At step 714, these variations are effectively subtracted one from the other and fingerprints of the monitor substrate and monitor patterning device are calculated, which are relative to the reference substrate. These relative fingerprints are stored in association with ID information for the patterning device and the monitor substrate, so that they may be recalled later. The monitor substrate and reference substrate are stripped of their resist at step 716 so that the substrate can be subsequently used. The reference substrate can be provided to storage, as it will be used infrequently from now on.

Note at this point that in this embodiment the metrology on the reference substrate has not been performed on the exposure tool A itself. Consequently, the calibration value of the reference substrate according to conventional processes has been lost. Instead, however, there has been produced a reference substrate and a monitor substrate that have been exposed under (assumed) identical conditions on the tool, and that have been measured and compared on the identical metrology unit. Therefore, although the pattern on each substrate is distorted by deviations in both the lithographic tool and the metrology unit, which cannot be known, the relative fingerprints calculated at step 714 capture perfectly the deviations of one specific monitor substrate and patterning device, relative to the reference substrate. That is to say, while the individual fingerprints are apparatus-specific, the relative fingerprints are apparatus-independent. By adapting the LACU software to include these relative fingerprints as corrections in all subsequent measurements and calibrations, the low-cost monitor substrate can be used effectively as a high-quality reference substrate through the normal stability monitoring process. Any number of monitor substrates and patterning devices can be measured against the reference substrate. Provided relative fingerprints are correctly measured and associated with their respective patterning device and/or substrate, any number of individual monitor substrates can be used as high-quality references for calibration and stability control of a number of tools.

To illustrate, process 730 now replaces processes 600 and 620 for the setting up of a tool (say 'tool X'). At step 732, an identified monitor substrate and patterning device, previously processed by process 700, are provided to the tool X. At step 734 the monitor substrate is exposed in the tool X and transferred to metrology unit 515. At step 736, the metrology unit measures one or more baseline fingerprints in a manner similar to step 648 in the FIG. 4 process. At this point, however, the tool has not been set to a desired condition, so the baseline fingerprint is arbitrary and of little use in of itself. At step 737, however, the relative fingerprints from step 714 which correspond to the particular substrate and patterning device being used are retrieved and subtracted from the corresponding fingerprint measured at step 736. The result of this subtraction now represents the 'true' fingerprint of tool X relative to the reference substrate, and can be used at step 738 to store calibration data for tool X. This data is used for exposure of a product substrate in production process 750. The calibration can also serve as the baseline for stability monitoring, without separately storing a stability monitoring fingerprint (in other words, the baseline fingerprint becomes simply zero).

At step 739, the monitor substrate is stripped for future use in the daily stability monitoring process represented briefly at step 740. Path 756 represents the re-use of a monitor substrate in this way. This is the same as the process 640, in which only changes from the baseline fingerprint is measured, and a suitable correction is fed into the production process 750 (loop 1 in FIG. 3).

As noted above, in this embodiment the monitor substrate and reference substrate are compared on a common metrology unit and exposed on a common tool. The tool does not need to be specially set up, in order for the relative fingerprints to accurately represent the relationship between the monitor substrate and the reference substrate. Consequently, when a monitor substrate becomes worn out or damaged, the process 722 to create a new one is less disruptive than the existing process 622. Path 758 represents the decision to scrap a worn out monitor substrate and create a new one.

Calibration and Stability Control—Modified Method

Figure 6:
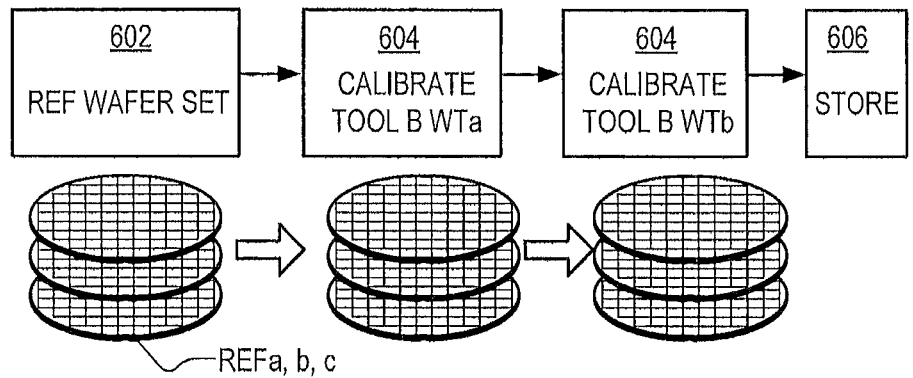
FIG. 6 illustrates a reference substrate set being used in the method of FIG. 4.

For comparison, FIG. 6 illustrates schematically a simplified implementation of the measurement step 604, for example in the case of tool B. A set of reference substrates REFa, b, c is used, rather than a single substrate, so that measurements can be made with some redundancy and with some statistical robustness. These substrates are loaded in turn onto a first table (chuck) WTa and patterns of marks are applied on top of (etched) reference marks by exposing them with a first image. The substrates are then transferred to the other chuck WTb and exposures repeated with a second image shifted slightly so as not to overly the first image. After exposure, metrology apparatus within the tool or outside the tool is used to measure overlay error from marks within the first and second images. Additional measurements can be made, using the metrology functions of the lithographic apparatus, of features of the same or further reference substrates. The results of these measurements, statistically combined from the reference substrates and the two chucks, can be used to calculate a fingerprint of the apparatus. Treating the measurements of first and second images separately, fingerprints specific to each chuck can be obtained.

Reviewing the technology described above, it uses multiple substrates with the same first layer image and layout, etched or in resist, in combination with measurements to calibrate and monitor different lithographic parameters. Although one set of reference substrates REFa, b, c is mentioned in the simplified schematic of FIG. 5, in practice different sets of parameters may require calibration, and these may be performed using different reference substrates, or by repeated processing of the same substrates. Calibration results are then subject to variation due to process and inaccuracy between the different tests. In the method of FIG. 5, the calculation of the relative fingerprints is subject to some inaccuracy, and degradation. With regard to throughput, a substrate is reworked or another set of substrates is used, to run another type of test, both of which add to tool down time.

Figure 7:
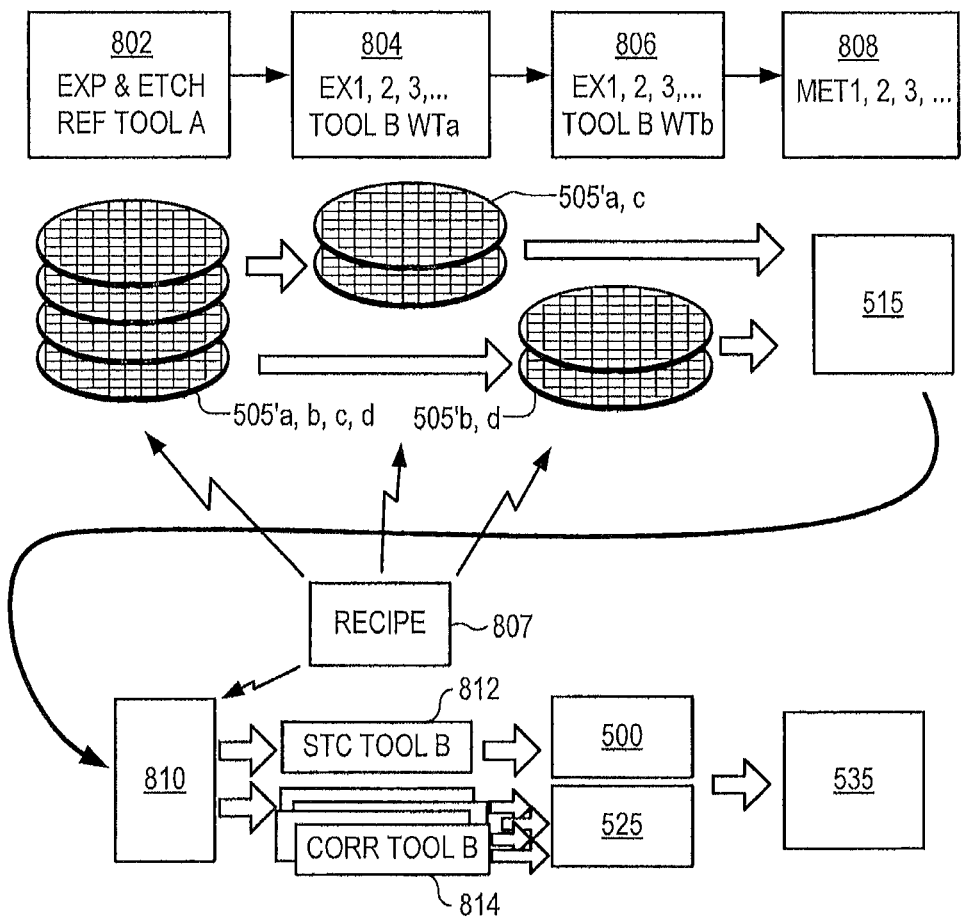
FIG. 7 illustrates a calibration substrate set being created and used in a modified calibration method according to an embodiment of the present invention.

FIG. 7 illustrates schematically a modification of the calibration and stability control process according to an embodiment of the present invention. This modification in some embodiments enables the operator of lithographic tools to reduce the loss of throughput associated with setup processes such as the on-tool measurement steps of setup process 600. Alternatively or in addition, the modification can be used to enable greater accuracy to be achieved in the calibration, as will be described below.

As in the method of FIG. 5, the modified method makes use of overlay measurement between image layers on a calibration or monitor substrate to obtain relative measurement between reference marks created by a reference tool, for example tool A, and marks created by a tool under test, for example tool B. Rather than expose and process the substrate multiple times for different tests, however, an embodiment of the method uses multiple exposures to combine multiple tests in a single process.

At step 802 a set of calibration and monitoring substrates are exposed using reference tool A. Four substrates 505'a to 505'd are illustrated, contrasting with the three substrates REFa, b, c in FIG. 6. The reference sign 505' is used to indicate that the pattern applied to these substrates comprises a set of overlay targets and can be similar in form, or even identical, to that used for the stability monitoring substrate 505 of the previously described methods. In the illustrated embodiment, the set of four substrates is then split into two pairs 505'a, c and 505'b, d. In step 804, the first pair of substrates is mounted on the first chuck WTa of tool B and exposed multiple times (EX1, EX2, EX3, . . . etc) with a pattern of overlying marks. Between the different exposures, the patterning device M and the pattern do not change, but one or more parameters of the process are changed in a certain sequence, so as to test different aspects of the lithography apparatus. Examples of the parameters will be given below. Each exposure can apply the pattern to every field of the substrate, or just selected fields or parts of fields. Where two exposures are applying an overlying pattern at the same mark location, small shifts can be applied between the exposures, so that they can be measured separately. This principle will be illustrated later in more detail. Similarly, at step 806 the second pair of substrates are loaded onto the second chuck WTb and exposed multiple times (EX1, EX2, EX3, . . . ) with the pattern of overlying marks, changing one or more parameters of the process between exposures. The sequence of exposures and parameter variations for each chuck are defined in a "recipe" 807 that is stored in a database in association with identification of each substrate, so that the test results can be interpreted later with appropriate knowledge of the one or more parameters applied at the time of exposure. The exposure sequence for the set of substrates can be automated by supplying the recipe to the manufacturing execution system 535 that controls the lithography tool. If the manufacturing execution system 535 is not adaptable to such a sequence, a separate setup controller can be provided.

In the embodiment illustrated, different substrates are dedicated to different chucks WTa, WTb and used in steps 804 and 806 respectively, but this is a matter of choice for the implementer. In an embodiment (not separately illustrated), the same substrates are loaded onto and exposed on both chucks or on just one chuck. The marks made using each chuck are still formed and measured separately, however. The marks made using each chuck can be distinguished for example by using shifted copies of the reference marks and using a different shift of position when exposing the overlying marks on the chuck(s).

At step 808, the exposed substrates are transferred to the metrology unit 515, where each mark can be measured for overlay. Post-exposure bake (and optionally develop and etch) may be performed to improved contrast, as described already above. In the metrology unit, different measurements MET1, MET2, etc are performed, reading the results of each exposure. The results of the different exposures can be read separately, even at the same mark position, by using the shifts as mentioned above. As is customary, the measurements may be performed on only a sample of the marks available, according to a desired compromise between accuracy (noise) and measurement time.

At step 810, the measurement results are stored in a database and processed to calculate fingerprints (corrections) for the individual tool B, at a general level and at a chuck-to-chuck level, as before. The lithographic cluster (litho cell) includes several processing units (computers), and it is not important which of these is or are used to make the calculations. For compatibility with the existing stability monitoring system, a first output of the calculation is a set of stability control parameters 812. These are supplied at an appropriate time to the stability module 500 (FIG. 3). Then other sets of corrections 814 are output to the manufacturing execution system 535. Thanks to the multiple exposures with different parameters, the measurement data can be analyzed to isolate individual corrections (for example interfield or intrafield fingerprints), that are specific to particular parameters and/or subsystems. These various corrections 814 can be expressed in whatever form is appropriate and supplied to APC 525, to manufacturing execution system 535 or such other controller as is appropriate to implement them. Depending on the nature of the correction, different ones of the existing controllers in the system, or a new controller, may be instructed to make each type of correction. Some types of correction may be applied within firmware of the apparatus or its subsystems, changing one or more so-called machine constants, while others may be applied in a recipe specific to a substrate lot or process.

The parameters that can be varied between exposures is virtually unlimited. Examples of parameters that may be varied between exposures in a typical scanner installation might be for example:

Field size
Field centers
Illumination modes (dipole-X, dipole-Y, quadrupole etc.)
Scan up/down direction
Step left/right direction
Different alignment models (linear, higher order)

Corrections (calibrations) can be derived by recalling the multi-exposure recipe and deconvolving the influences of the varied parameters to extract parameter-specific corrections. As mentioned in the example of chuck-to-chuck variations, corrections can be relative to a default value of the parameter, or relative to an average. For example, one can define the correction for a default illumination mode to be zero, and calculate corrections specific to each other illumination mode that are relative to that zero. Alternatively, one can define the average of all the illumination modes to be zero, in which case every illumination mode has a specific correction relative to that zero. The choice of approach can be different for each parameter.

Since the exposures targeting a reference image (EX1, EX2, etc.) on each chuck take place without removing the substrate from the same chuck or developing the resist, the test results are substantially isolated from noise that is normally introduced by variations in post-exposure processing, substrate alignment and clamping. The time to calibrate the system can be reduced because there is, for example, no wait needed for the reference substrates to be reworked. Reducing tool down-time for recovery from unplanned shutdown conditions and planned maintenance is valuable. Routine calibration tasks that currently interrupt production for several hours can be reduced effectively to the time it takes to expose the calibration substrates, for example, 20 minutes. After that shortened interruption, the operation of the tool can resume with existing calibration values, while metrology steps are conducted on the metrology unit and new corrections are calculated off-line. The new corrections can be uploaded to the tool at a convenient point in a production sequence. New corrections can be phased in, if desired, to avoid disrupting work in progress. For example, it may be preferable to introduce a parameter change in three or more steps, rather than in one big step, so as to minimize disruption of overlay between layers applied before and after the calibration (i.e. work-in-progress). As another technique, production on a given tool can be limited to less critical product layers until the full calibration is implemented and verified.

Further, because of this reduced time requirement, the system designer and/or operator can contemplate performing a wider range of tests and implementing correspondingly more corrections than in the known systems. One or more tests may correspond to particular subsystems of the lithographic apparatus, and an embodiment allows more individual subsystems to be tested and adjusted. While any of these subsystems could be tested and adjusted using known processes, the downtime incurred to perform each additional test forces one to be more selective and accept a compromise between improving system accuracy and stability and maintaining productivity in a commercial setting.

The process of FIG. 7 and variations of it can be applied within any calibration process. For example the calibration method illustrated in FIG. 4 can be modified by applying multiple exposures to test different parameters in any or all of the steps 603, 626, and/or 646. In the process of FIG. 5, multiple exposures with different parameters can be applied in any or all of the steps 704, 708, and/or 734. It should also be noted that multiple exposures with different parameters can be applied at the time of creating the reference marks on the substrate (e.g. step 800) as a bottom layer. The recipe for creating the reference marks can be correlated with the recipe for subsequent exposures, so that the influence of other parameters is effectively subtracted on the substrate, before overlay errors are measured.

As mentioned above, the one or more apparatus fingerprints and their corresponding corrections can be defined on an interfield basis (varying across the substrate as a whole) and/or on an intrafield basis (varying in a characteristic way across each field, independent of field position). Among the parameter-specific corrections 952a etc that are calculated from the multiple exposures and multiple measurements, some will be appropriate to record as interfield corrections, while others will be appropriate to record as intrafield corrections. Parameter-specific interfield corrections could include for example chuck-to-chuck variation and/or alignment model variation. Parameter-specific intrafield corrections could include for example corrections specific to scan up/scan down exposures and/or step left/step right and corrections for different illumination modes.

Figure 8:
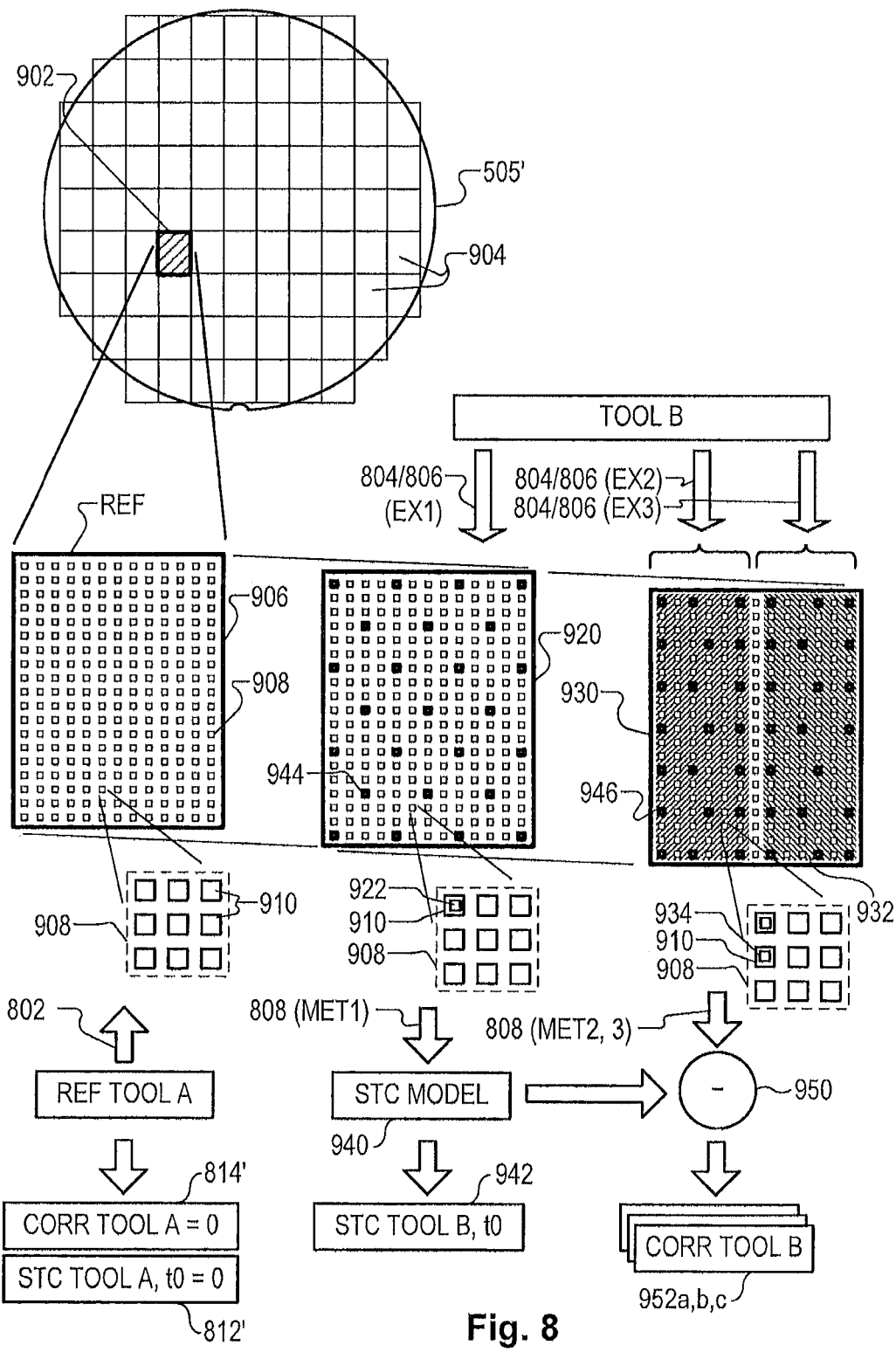
FIG. 8 illustrates multiple exposures and calculation of corrections in an example of the method of FIG. 7.

FIG. 8 illustrates an example exposure sequence on one field 902 of one calibration substrate 505' in the method of FIG. 7. According to a field size and layout pattern, numerous fields 904 can be exposed in a step and scan sequence. At 906, the calibration target pattern is shown as applied to (etched) in the field 902 (step 802). The pattern is defined by providing a special calibration & monitoring patterning device (patterning device MA) in the reference tool A. In a simple example, the target pattern 906 comprises overlay targets 908 uniformly spaced in a grid pattern (here a 13 by 19 grid) across every field 902, 904. As illustrated in enlarged detail below the image 906, each target 908 may comprise a plurality of individual target marks 910, offset from one another in a predefined pattern. This is to allow multiple overlay measurements at substantially the same location. The offsets may be for example measured in tens of microns, while the field size is measured in tens of millimeters.

Within each individual target mark 910, features may typically be provided to allow measurement of overlay in both X and Y directions in a single composite target, or different targets may be provided. The drawing shows each target as a simple box for the sake of illustration only. The targets may indeed be of 'box in box' type similar to that illustrated; they may be gratings type targets, composite targets having box and grating features, or any usable type. The exact type of target, and indeed the manner of measuring overlay from the target after exposure, is a matter of implementation. While in this example a reference image providing multiple individual target marks 910 with shifts is illustrated, this is not essential. Other embodiments may be envisaged in which multiple marks are printed with shifts relative to a single reference mark, and separate overlay values can be obtained from them. As also illustrated, even with the types of mark illustrated, multiple exposures can be made without shifts, where a pattern is applied at different field positions across the substrate, or different portions of a field are patterned in different exposures.

Choosing tool A as the reference tool for setting up a fleet of tools, tool corrections for tool A and stability control values for tool A at time t0 are set by definition to be zero (steps 812', 814', not shown in FIG. 7). (They may be set by definition at some other arbitrary value, if desired, for example to provide continuity with existing settings.)

After loading the calibration substrate 505' into subject tool B, a first exposure EX1 is performed to apply image 920 to the same field 902—that is on top of the target pattern 906. Referring again to the enlarged detail below image 920, a mark 922 is overlaid onto one of the individual target marks 910 within target 908. Without removing the substrate from whichever chuck it is on (substrate table WTa or WTb), further exposures EX2, EX3 and more are made, while using different parameters. In the illustrated example, the illumination on the patterning device is masked ("bladed down") to illuminate only a central band representing half of the whole field area. In exposure EX2, this central band is printed with a shifted field center so as to cover the left hand side of field 902, forming a second image 930. In exposure EX3, this central band is printed with an oppositely shifted field center so as to cover the right hand side of field 902, forming a third image 932. As shown in the enlarged detail below image 932, a mark 934 is overlaid onto one of the individual target marks 910 other than the one printed in exposure EX1. This is achieved by programming an appropriate shift into the exposures. Because exposures EX2 and EX3 expose different halves of the field 902, they can use the same shift, although of course they could use different shifts. Depending on the recipe, these exposures EX1, EX2, EX3 can be made at every field position 904, or only a subset.

The first exposure EX1 in this example is designed and used to obtain measurements for the stability control. In the metrology step 808, measurements MET1 extract parameters 940 of a model 942 for the stability module 500. The model 942 is the same across all tools. The parameters 940 express the state of the tool at time t0. To calculate the model parameters, overlay measurements are taken from a subset of the marks 910/922, indicated for example by the bold positions 944 in image 920. Combining these sample points from all fields 904 across the substrate allows a detailed mapping of distortions of the substrate grid imposed by this particular tool, which in turn can be corrected to reduce overlay error in exposure of a product substrate W. Updated parameters can be produced at subsequent times, as in the example methods, by repeating exposure EX1. Repetition of the other exposures is optional.

Assuming multiple exposures have been made and more details corrections are desired, metrology step 808 continues with measurements MET2, MET3 etc., reading overlay from the marks 910/934 in the images 930, 932. Again, sampling a subset of the targets 908 is sufficient, illustrated for example by the bold positions 946. In a step 950 within processing step 810, corrections 952a, b, c for tool B that are specific to the variations in field center or other parameters are calculated, while subtracting the correction that is already modeled by the stability control parameters 942. The same principle can be extended to further exposures and parameters to extract multiple corrections 952a, b, c, of the type listed above. Calculations are performed so that corrections can be applied cumulatively in accordance with the full parameter set of any given exposure. Because the stability model correction for time t0 is subtracted, the corrections 952a, b, c can be applied whenever the stability correction parameters are updated, without repeating the whole multiple exposure process. Naturally the deconvolution of corrections 952a, b, c is performed so that the cumulative effect of all the corrections used matches as closely as possible the total overlay error observed in any exposure. Different sets of corrections can be defined and selected to be calculated and used, based on the same set of measurements. In this way, possible correction schemes can be modeled and compared with one another and with actual production results, before committing to implementing a new correction scheme.

Figure 9:
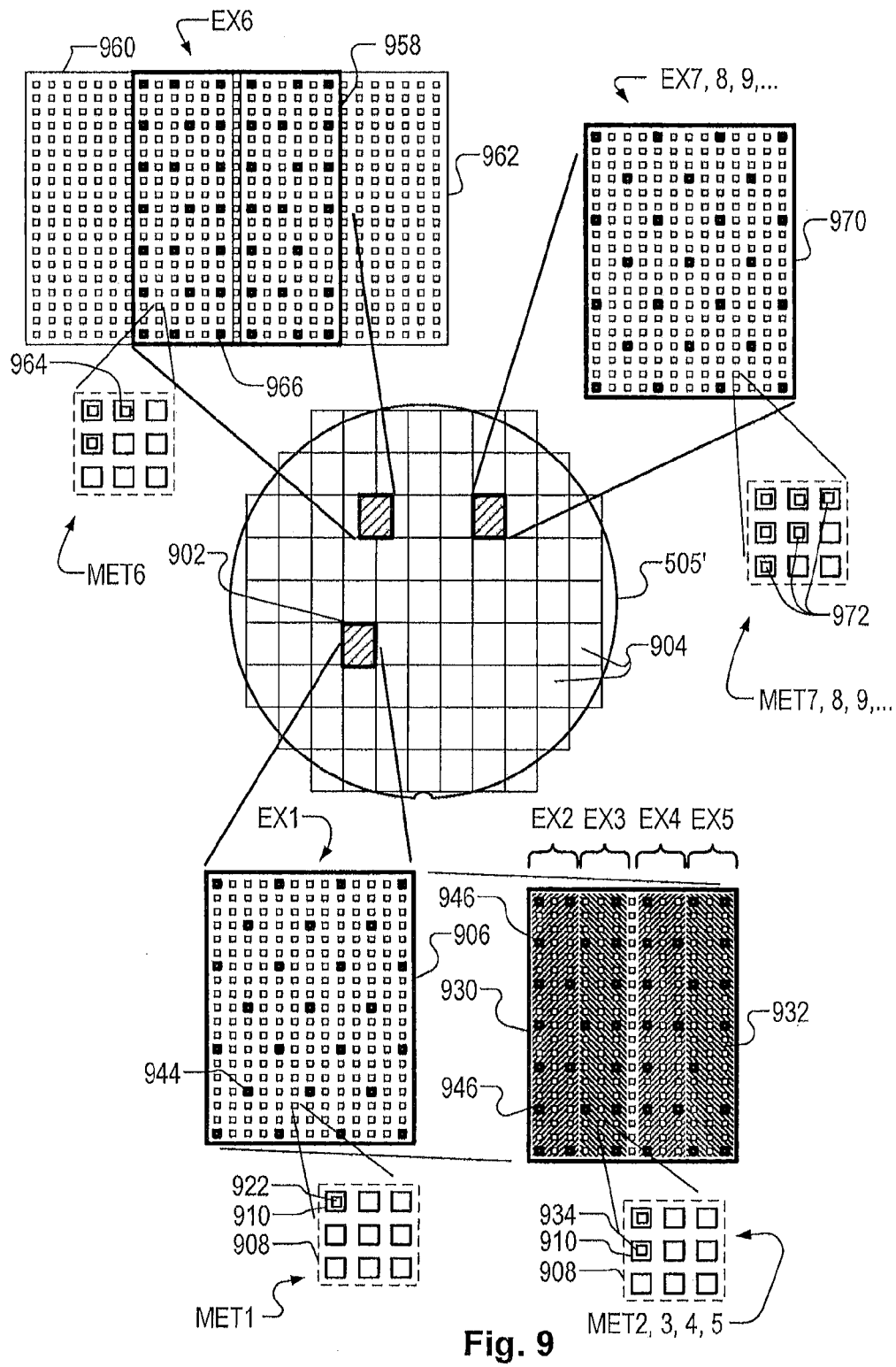
FIG. 9 illustrates multiple exposures and calculation of corrections in a further example of the method of FIG. 7.
Figure 10:
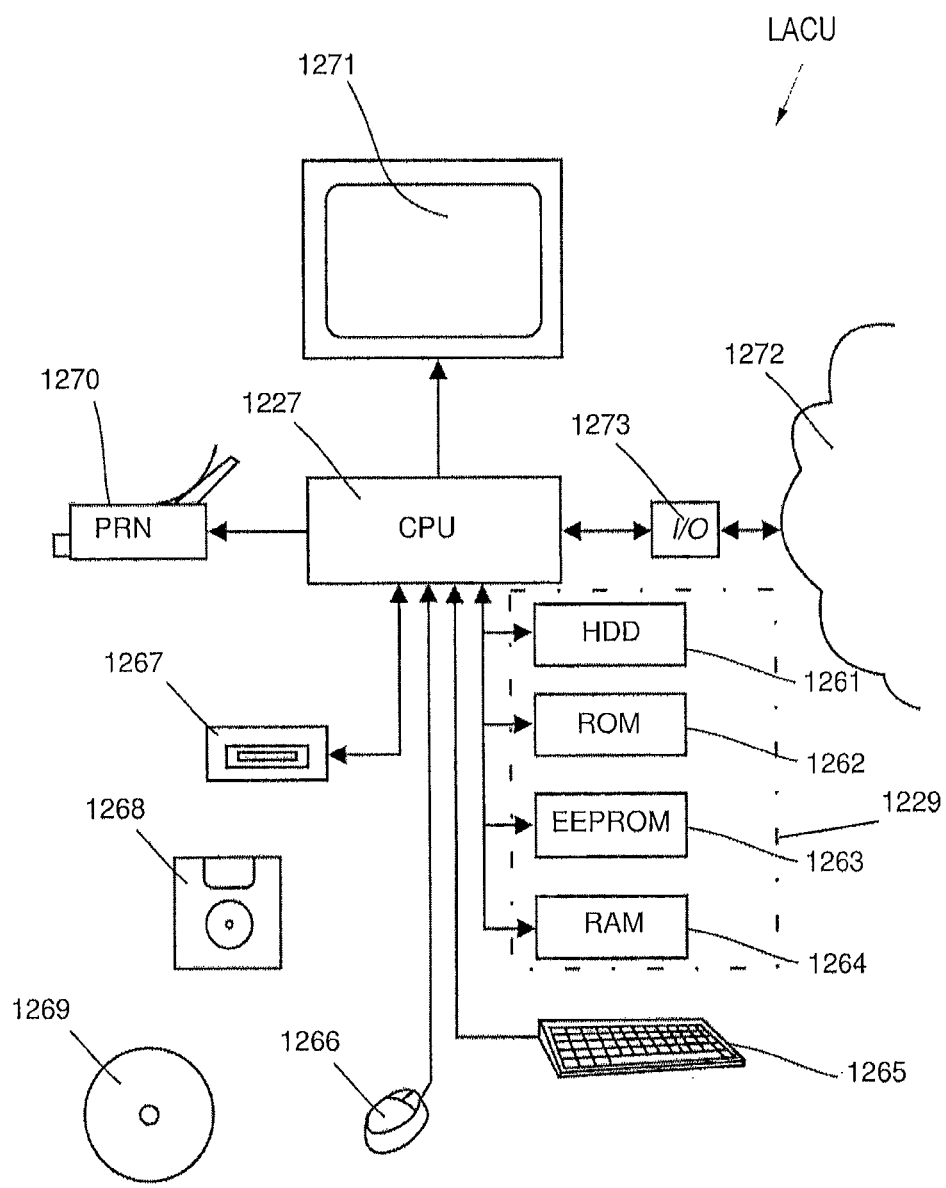
FIG. 10 is a view of a lithographic apparatus control unit controlling the apparatus and method, according to an embodiment of the present invention.

FIG. 9 illustrates another example exposure sequence. The same reference signs are the same as in FIG. 8 where applicable. As in FIG. 8, a target pattern is provided (etched) onto all fields 902, 904 of calibration substrate 505' using a reference tool. Targets 908 with individual target marks 910 are provided by which overlay error in exposures made by a subject tool B can be measured. Exposure EX1 prints image 906 for use in calculating stability control model parameters. Sample positions 944 are measured for this purpose. Similar to the exposures EX2, EX3 in FIG. 8, this sequence provides four exposures EX2 to EX5 in which the image on patterning device is bladed down to just a central quarter of the field. Images 930, 932 etc. are formed with different field centers. A shift is applied so that marks 934 in these four images are applied at a shifted location, and not on top of the marks 922 formed in exposure EX1. They can be measured in steps MET2 to MET5. Note that these metrology steps MET are defined in terms of the exposure parameters to which they relate, and not necessarily their order of performance. They are more likely to be performed simultaneously, or rather in an interleaved fashion, as the metrology unit collects overlay readings from across the substrate according to a most efficient path. The readings corresponding to each step can be distinguished in the manner in which they are stored in a results database.

In a sixth exposure EX6, a full field image 958 is printed with a shifted field center, so as to fall half on target field 960 and half on a neighboring field 962 (The pattern target mark 908 is designed such that the regular grid extends across field boundaries). Each mark 964 in the image is printed over a different individual target mark 910 from those used in exposures EX1-EX5, so that fields 960 and 962 need not be different from those printed in the other exposures. Sample positions 966 are measured, for example. In seventh and subsequent exposures, EX7 etc., further images 970 are printed at one or more shifted positions 972, with other variations in the exposure parameters. For example, exposures EX7 and EX8 may have different scan directions per field, and/or different step directions. Exposures may be made with the positioning systems of the tool applying a different alignment model, for example implementing a linear model of the substrate grid or a higher order model. Between different exposures, there may be only one parameter varied, or exposures may be made with different permutations of parameters, different per field. Provided the number and distribution of the fields is wide enough, the effects of the different parameters can be deconvolved by the processing of the metrology results.

As mentioned above, the reference pattern on the substrate may be created on a reference tool with a recipe of varying exposure parameters. Provided the reference recipe and the subject tool exposure recipe are known, the calculations to deconvolve the influence of each parameter can be performed.

Even if the measured values are not used to apply corrections in the production of a device on a substrate W, the multiple exposures with varying parameters allow the operator or system designer to conduct virtual experiments as to the influence of different parameters, without substantially increasing the downtime of the production tool.

Calibration and Stability Control—Further Embodiments

Although it is an advantage that measurements previously performed on the lithographic tool itself now can be performed by a metrology unit outside the tool, an embodiment of the present invention is not limited to performing the measurements on a different metrology unit. Metrology systems of the tool itself can be used, if the throughput penalty is not the highest priority. Examples of this are described in U.S. patent application publication no. US 2012/0008127, the entire content of which is incorporated herein by reference.

CONCLUSION

As will be appreciated from the above, it is proposed herein to calibrate a lithography apparatus such as a scanner indirectly, through the medium of a calibration substrate on which patterns of marks have been overlaid by multiple exposures. Multiple parameters of the lithographic apparatus and the lithographic process as a whole can be tested. The methods newly disclosed permit an embodiment which is faster than known calibration methods, because one does not need to wait for multiple substrates to pass through the litho cluster. The methods permit cheaper operation because fewer substrates are processed and fewer are reworked. Corrections can be calculated and applied with greater accuracy, because multiple test exposures see the same clamping, alignment and post-exposure processing.

Other embodiments offer different subsets of the above benefits and benefits of their own, as already explained above.

Lithography Apparatus Control Unit LACU & Other Processors

It should be understood that the lithography control unit LACU in the previous embodiments may be based on a computer assembly as shown in FIG. 6. The computer assembly may be a dedicated computer in the form of a control unit in embodiments of the assembly according to the present invention or, alternatively, be a central computer controlling the lithographic apparatus. The computer assembly may be arranged for loading a computer program product comprising computer executable code. This may enable the computer assembly, when the computer program product is downloaded, to implement the novel operations of the lithographic apparatus including the metrology unit, in accordance with the methods described above.

Memory 1229 connected to processor 1227 may comprise a number of memory components like a hard disk 1231, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away.

The processor 1227 may be connected to some kind of user interface, for instance a keyboard 1265 or a mouse 1266. A touch screen, track ball, speech converter or other interfaces that are known to persons skilled in the art may be used.

The processor 1227 may be connected to a reading unit 1267, which is arranged to read data, e.g., in the form of computer executable code, from and under some circumstances store data on a data carrier, like a removable disc 1268 or a CDROM 1269. Also DVD's or other data carriers known to persons skilled in the art may be used.

The processor 1227 may be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of one or more transmitters/receivers 1273 responsible for input/output (I/O). The processor 1227 may be arranged to communicate with other communication systems via the communications network 1272. In an embodiment, one or more external computers (not shown), for instance a personal computer of an operator, can log into the processor 1227 via the communications network 1272.

The processor 1227 may be implemented as an independent system or as a number of processing units that operate in parallel, wherein each processing unit is arranged to execute sub-tasks of a larger program. The processing units may be divided into one or more main processing units with several sub-processing units. One or more processing units of the processor 1227 may even be located a distance away from another processing unit and communicate via communications network 1272. Separate processing units external to the lithographic apparatus may be used, for example, for implementing the scanner stability module 500, Advanced Process Control (APC) module 525 and Manufacturing Execution System (MES) 535. These processing units can have the same general architecture as the one illustrated here. The processing step 810 in the above method can be implemented on one of these processors, or a separate processor. The sequences of exposures and metrology steps can be automated in accordance with a defined recipe under control of one or more of the above mentioned processors, or one or more separate processors dedicated to the purpose.

It is observed that, although all connections in the drawing are shown as physical connections, one or more of these connections can be made wireless. They are only intended to show that "connected" units are arranged to communicate with one another in some way. The computer system can be any signal processing system with analog and/or digital and/or software technology arranged to perform the functions discussed here.

Embodiments are provided according to the following number clauses:
1. A method of calibrating a lithographic apparatus, the method comprising:
   (a) supporting a calibration substrate in the lithographic apparatus using a substrate support, the calibration substrate carrying a set of first marks;

(b) operating a patterning system to apply a pattern comprising a set of second marks onto the calibration substrate, each second mark overlying a first mark;

(c) obtaining an overlay measurement on the basis of the overlying first and second marks; and (d) using the overlay measurement to calculate calibration data to correct an apparatus-specific deviation of the lithographic apparatus, wherein operating the patterning system to apply the pattern comprising the set of second marks is repeated while the substrate remains supported by the substrate support so as to apply different sets of second marks while varying an operating parameter of the lithographic apparatus between applying the sets of second marks and including a shift between the different sets of second marks such that an overlay measurement of each set can be distinguished.

2. The method as in clause 1, wherein step (d) comprises calculating a first apparatus-specific correction and subtracting the first apparatus-specific correction from at least some of the overlay measurements before calculating a further apparatus-specific correction.

3. The method as in clause 2, further comprising at a later time repeating steps (a) to (d) to obtain an updated first apparatus-specific correction without necessarily repeating step (b) and without the recalculating the further apparatus-specific correction.

4. The method as in any of clauses 1-3, wherein steps (a) to (d) are repeated at intervals to maintain calibration of the lithographic apparatus, and wherein repetitions with fewer patterning steps and fewer variations of parameters are performed more frequently than repetitions with a greater number of patterning steps and parameter variations.

5. The method as in any of clauses 1-4, wherein the first marks are provided in multiple shifted versions so as to permit overlay measurement using the second marks of the pattern applied with multiple shifts.

6. The method as in any of clauses 1-5, wherein the second marks are applied at different portions of the substrate in different repetitions of step (b).

7. The method as in any of clauses 1-6, wherein between repetitions of step (b) a field size, or a field center, or both, is varied.

8. The method as in any of clauses 1-7, wherein between repetitions of step (b) at least one parameter selected from the following is varied: illumination mode, scan direction, step direction, and/or alignment model.

9. The method as in any of clauses 1-8, wherein the apparatus-specific calibration data defines a parameter-specific correction based on knowledge of the parameter variations used to form different measured marks.

10. The method as in clause 9, wherein the patterning subsystem is arranged to apply a field pattern repeatedly at different field positions across each substrate, and wherein the apparatus-specific calibration data defines a parameter-specific correction to be applied across the substrate as a whole and a parameter-specific correction to be applied within each field.

11. The method as in any of clauses 1-10, wherein the lithographic apparatus comprises more than one substrate support and wherein using the overlay measurement to calculate calibration data comprises calculating at least some calibration data specific to each substrate support.

12. A method of manufacturing a device wherein a lithographic apparatus is used to apply a device pattern to a device substrate, and wherein as a preliminary step the lithographic apparatus is calibrated by a method as in any of clauses 1-11.

13. The method as in clause 12, wherein concurrently with performance of the step (c) and/or (d) of the method the lithographic apparatus is operated to apply device patterns to a device substrate and, after completion of step (c) and/or (d) a device pattern is applied to a further device substrate using the obtained calibration data.

14. A data processing apparatus programmed to calculate parameter-specific, apparatus-specific calibration data for a lithographic apparatus in accordance a method as in any of clauses 1-13, based on a set of overlay measurements and on knowledge of parameter variations used to form different measured marks.

15. The data processing apparatus as in clause 14, further programmed to cause the lithographic apparatus to perform step (b) of the method in accordance with a stored recipe that defines a sequence of repetitions of step (b) and associated parameter variations.

16. A computer program product comprising instructions to cause a programmable data processing apparatus to perform the method of any of clauses 1-13 or as the data processing apparatus of clause 14 or clause 15.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively, and vice versa. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the spirit and scope of the claims set out below.

What is claimed is:

1. A method comprising;
    (a) supporting a calibration substrate in a lithographic apparatus using a substrate support, the calibration substrate carrying a set of first marks;
    (b) operating a patterning system to apply a pattern comprising a set of second marks onto the calibration substrate, each second mark overlying a first mark;
    (c) obtaining an overlay measurement on the basis of the overlying first and second marks; and
    (d) using the overlay measurement to calculate calibration data to correct an apparatus-specific deviation of the lithographic apparatus,
    wherein operating the patterning system to apply the pattern comprising the set of second marks is repeated while the substrate remains supported by the substrate support so as to apply different sets of second marks while varying an operating parameter of the lithographic apparatus, other than or in addition to an operating parameter to induce overlay shift, between applying the sets of second marks and including a shift between the different sets of second marks such that an overlay measurement of each set can be distinguished.

2. The method as claimed in claim 1, wherein step (d) comprises calculating a first apparatus-specific correction and subtracting the first apparatus-specific correction from at least some of the overlay measurements before calculating a further apparatus-specific correction.

3. The method as claimed in claim 2, further comprising at a later time repeating steps (c) to (d) to obtain an updated first apparatus-specific correction without the recalculating the further apparatus-specific correction.

4. The method as claimed in claim 1, wherein steps (a) to (d) are repeated at intervals to maintain calibration of the lithographic apparatus, and wherein repetitions with fewer patterning steps and fewer variations of parameters are performed more frequently than repetitions with a greater number of patterning steps and parameter variations.

5. The method as claimed in claim 1, wherein the first marks are provided in multiple shifted versions so as to permit overlay measurement using the second marks of the pattern applied with multiple shifts.

6. The method as claimed in claim 1, wherein the second marks are applied at different portions of the substrate in different repetitions of step (b).

7. The method as claimed in claim 1, wherein between repetitions of step (b) a field size, or a field center, or both, is varied.

8. The method as claimed in claim 1, wherein between repetitions of step (b) at least one parameter selected from the following is varied: illumination mode, scan direction, step direction, and/or alignment model.

9. The method as claimed in claim 1, wherein the apparatus-specific calibration data defines a parameter-specific correction based on knowledge of the parameter variations used to form different measured marks.

10. The method as claimed in claim 9, wherein the patterning system is arranged to apply a field pattern repeatedly at different field positions across each substrate, and wherein the apparatus-specific calibration data defines a parameter-specific correction to be applied across the substrate as a whole and a parameter-specific correction to be applied within each field.

11. The method as claimed in claim 1, wherein the lithographic apparatus comprises more than one substrate support and wherein using the overlay measurement to calculate calibration data comprises calculating at least some calibration data specific to each substrate support.

12. The method as claimed in claim 1, further comprising manufacturing a device by applying a device pattern to a device substrate using the lithographic apparatus, wherein the lithographic apparatus is calibrated by the calibration data prior to applying a device pattern.

13. The method as claimed in claim 12, wherein concurrently with performance of the step (c) and/or (d) the lithographic apparatus is operated to apply device patterns to a device substrate and, after completion of step (c) and/or (d) a device pattern is applied to a further device substrate using the obtained calibration data.

14. A data processing apparatus programmed to calculate parameter-specific, apparatus-specific calibration data for a lithographic apparatus based on a set of overlay measurements and on knowledge of parameter variations used to form different measured marks, the apparatus configured and programmed to:
    cause operation of a patterning system to apply a pattern comprising a set of second marks onto a calibration substrate supported in a lithographic apparatus by a substrate support, the calibration substrate carrying a set of first marks and each second mark overlying a first mark;
    obtain an overlay measurement on the basis of the overlying first and second marks; and
    use the overlay measurement to calculate calibration data to correct an apparatus-specific deviation of the lithographic apparatus,
    wherein operation of the patterning system to apply the pattern comprising the set of second marks is repeated while the substrate remains supported by the substrate support so as to apply different sets of second marks while varying an operating parameter of the lithographic apparatus, other than or in addition to an operating parameter to induce overlay shift, between application of the sets of second marks and including a shift between the different sets of second marks such that an overlay measurement of each set can be distinguished.

15. The data processing apparatus as claimed in claim 14, further programmed to cause the lithographic apparatus to perform step (b) of the method in accordance with a stored recipe that defines a sequence of repetitions of step (b) and associated parameter variations.

16. A non-transitory computer program product comprising instructions to cause a programmable data processing apparatus to:
    cause operation of a patterning system to apply a pattern comprising a set of second marks onto a calibration substrate supported in a lithographic apparatus by a substrate support, the calibration substrate carrying a set of first marks and each second mark overlying a first mark;
    obtain an overlay measurement on the basis of the overlying first and second marks; and
    use the overlay measurement to calculate calibration data to correct an apparatus-specific deviation of the lithographic apparatus,
    wherein operation of the patterning system to apply the pattern comprising the set of second marks is repeated while the substrate remains supported by the substrate support so as to apply different sets of second marks while varying an operating parameter of the lithographic apparatus, other than or in addition to an operating parameter to induce overlay shift, between application of the sets of second marks and including a shift between the different sets of second marks such that an overlay measurement of each set can be distinguished.

17. The computer program product of claim 16, wherein the instructions to cause a programmable data processing apparatus to use the overlay measurement to calculate calibration data comprises instructions to cause a programmable data processing apparatus to calculate a first apparatus-specific correction and subtract the first apparatus-specific correction from at least some of the overlay measurements before calculations of a further apparatus-specific correction.

18. The computer program product of claim 16, wherein the first marks are provided in multiple shifted versions so as to permit overlay measurement using the second marks of the pattern applied with multiple shifts.

19. The computer program product of claim 16, wherein between repetitions of the operation of the patterning system to apply the pattern comprising the set of second marks, a field size, or a field center, or both, is varied.

20. The computer program product of claim 16, wherein the apparatus-specific calibration data defines a parameter-specific correction based on knowledge of the parameter variations used to form different measured marks.

* * * * *